United States Patent
Zhang

(10) Patent No.: US 7,719,080 B2
(45) Date of Patent: May 18, 2010

(54) SEMICONDUCTOR DEVICE WITH A CONDUCTION ENHANCEMENT LAYER

(75) Inventor: Qingchun Zhang, Cary, NC (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 45 days.

(21) Appl. No.: 11/157,229

(22) Filed: Jun. 20, 2005

(65) Prior Publication Data
US 2007/0013021 A1 Jan. 18, 2007

(51) Int. Cl.
*H01L 29/00* (2006.01)
*H01L 21/336* (2006.01)

(52) U.S. Cl. ............... 257/510; 257/213; 257/E29.005; 438/208

(58) Field of Classification Search .............. 257/500, 257/E29.169, E29.171, E29.183, E29.005, 257/E29.109, E29.242, E29.255, E29.262, 257/213, 263, 134, 135, 256, 272, 302, 510
See application file for complete search history.

(56) References Cited

U.S. PATENT DOCUMENTS

| | | | | |
|---|---|---|---|---|
| 5,488,236 | A * | 1/1996 | Baliga et al. | 257/132 |
| 5,753,938 | A | 5/1998 | Thapar et al. | 257/77 |
| 5,945,701 | A * | 8/1999 | Siergiej et al. | 257/285 |
| 6,097,046 | A | 8/2000 | Plumton | 257/266 |
| 6,252,288 | B1 * | 6/2001 | Chang | 257/471 |
| 6,380,569 | B1 * | 4/2002 | Chang et al. | 257/256 |
| 6,815,769 | B2 | 11/2004 | Pfirsch et al. | 257/341 |
| 6,906,356 | B1 | 6/2005 | Chang | 257/130 |
| 2004/0135178 | A1 | 7/2004 | Onose et al. | |
| 2005/0006716 | A1 * | 1/2005 | Kumar et al. | 257/500 |
| 2005/0029557 | A1 | 2/2005 | Hatakeyama et al. | |
| 2005/0230745 | A1 * | 10/2005 | Fatemizadeh et al. | 257/330 |
| 2006/0071295 | A1 * | 4/2006 | Chang | 257/510 |
| 2006/0220072 | A1 * | 10/2006 | Harris et al. | 257/256 |

OTHER PUBLICATIONS

Chang et al. "1500V and 10A SiC motor drive inverter module" 16th International Symposium on Power Semicondcutor Devices & IC's, May 24-27, 2004, pp. 351-354.*

B. J. Baliga, *Power Semiconductor Devices*, "Insulated Gate Bipolar Transistor", North Carolina State University, PWS Publishing Co. (1996) Chp. 8, p. 426.

J. Tan et al., "High-Voltage Accumulation-Layer UMOSFET'S in 4H-SiC", IEEE Electron Device Letters, vol. 19, No. 12 (Dec. 1998), pp. 487-489.

(Continued)

*Primary Examiner*—Howard Weiss
*Assistant Examiner*—Sarah K Salerno
(74) *Attorney, Agent, or Firm*—Koppel, Patrick, Heybl & Dawson

(57) ABSTRACT

A semiconductor device includes a drift layer of a first conductivity type having a doping concentration and a conduction layer also of the first conductivity type on the drift layer that has a doping concentration greater than the doping concentration of the drift layer. The device also includes a pair of trench structures, each including a trench contact at one end and a region of a second conductivity type opposite the first conductivity type, at another end. Each trench structure extends into and terminates within the conduction layer such that the second-conductivity-type region is within the conduction layer. A first contact structure is on the drift layer opposite the conduction layer while a second contact structure is on the conduction layer.

10 Claims, 5 Drawing Sheets

OTHER PUBLICATIONS

H. R. Chang et al., "500-V n-Channel Insulated-Gate Bipolar Transistor With a Trench Gate Structure", IEEE Transactions on Electron Devices, vol. 36, No. 9 (Sep. 1989) pp. 1824-1828.

U.S. Appl. No. 10/952,220, filed Sep. 27, 2004.

PCT International Search Report; Jul. 5, 2007; 5 pps.; in International Application No. PCT/US2006/022922.

PCT Written Opinion of the International Searching Authority; Jul. 5, 2007; 6 pps.; in International Application No. PCT/US2006/022922.

* cited by examiner

SEMICONDUCTOR DEVICE WITH A CONDUCTION ENHANCEMENT LAYER

BACKGROUND OF THE INVENTION

1. Field of the Invention

This invention relates to the field of semiconductor devices and more particularly to semiconductor devices having a conduction enhancement layer.

2. Description of Related Art

Semiconductor devices are increasingly required to accommodate high currents and/or high voltages without failing. Many high power applications call for the use of a semiconductor switch which is required to conduct a large current when turned on, and to block a high voltage when off.

One device used in such applications is the power metal-oxide-semiconductor field-effect transistor (MOSFET). As discussed in J. Baliga, Power Semiconductor Devices, PWS Publishing Co. (1996) at p. 426, a power MOSFET exhibits excellent fast switching capability and safe-operating-area. When designed to block relatively low voltages (less than 200 volts), the power MOSFET has a low on-resistance. However, on-resistance increases very rapidly when its breakdown voltage is increased. This makes the on-state power losses unacceptable where high DC supply voltages are used.

Another approach which has been explored to improve blocking voltage while maintaining low on-resistance has been the fabrication of FETs using silicon carbide (SiC). SiC has a wider bandgap than does silicon (Si), giving it a "critical electric field"—i.e., the peak electric field that a material can withstand without breaking down—that is an order of magnitude higher than that of Si. This allows much higher doping and a much thinner drift layer for a given blocking voltage, resulting in a very low specific on-resistance in SiC-based devices.

Unfortunately, many SiC devices developed to date exhibit severe commercialization constraints. One such device is described in "High-voltage Accumulation-Layer UMOSFET's in 4H-SiC", IEEE Electron Device Letters, Vol. 19, No. 12 (December 1998), pp. 487-489. This SiC-based device employs a UMOS structure, with an accumulation channel formed on the sidewalls of the trench by epitaxial growth to attain enhancement mode operation. It requires an additional epitaxial layer under the p-base to promote current spreading and achieve low on-resistance. The doping levels and the thicknesses of the sidewall epilayer and the epilayer under the p-base must be tightly controlled to achieve an enhancement mode device with low on-resistance. These demands result in a complex fabrication process which is unsuitable for large-scale manufacturing.

Another high power device is the insulated-gate bipolar transistor (IGBT). An IGBT with a trench gate structure is described, for example, in H.-R. Chang and B. Baliga, "500-V n-Channel Insulated-Gate Bipolar Transistor with a Trench Gate Structure", IEEE Transactions on Electron Devices, Vol. 36, No. 9, September 1989, pp. 1824-1828. In operation, a positive gate voltage forms N-type inversion layers, through which electrons flow to provide the base drive needed to turn on the device's PNP transistor.

However, the IGBT has disadvantages which render it unsuitable for some applications. Because the structure is basically a transistor with gain, there will be some recombination in its N− drift region, causing the device to exhibit a high forward voltage drop. Another drawback to IGBTs is that they can "latch-up", at which point they are no longer under the control of the gate voltage. When in this mode, conduction through the device can no longer be controlled by the gate voltage.

SUMMARY OF THE INVENTION

Briefly, and in general terms, the invention is directed to semiconductor devices with a conduction enhancement layer. In one aspect, such a semiconductor device includes a drift layer of a first conductivity type having a first doping concentration and a conduction layer also of the first conductivity type that is on the drift layer and has a second doping concentration greater than the first doping concentration, i.e., the doping concentration of the drift layer. The device also includes a pair of trench structures. Each trench structure includes a trench contact at one end and a region of a second conductivity type that is opposite the first conductivity type, at another end. Each trench structure extends into and terminates within the conduction layer such that the second-conductivity-type region of the trench structure is within the conduction layer. A first contact structure is on the drift layer opposite the conduction layer while a second contact structure is on the conduction layer. During device operation, the conduction layer, with its higher doping concentration, shrinks the depletion region spreading from the second conductivity type region at the end of the trench structures. The shrinking of the depletion region can significantly improve the device on-resistance while maintaining the blocking capability.

In another aspect, the invention relates to an N type field-effect transistor (FET) switch that includes an N− drift layer having a doping concentration and an N type conduction layer on the N− drift layer that has a doping concentration greater than the doping concentration of the N-drift layer. The FET also includes a pair of gate structures, each including a gate contact at one end and a P region at another end. Each gate structure extends into and terminates within the conduction layer such that the P region is within the conduction layer. A drain contact structure including an N+ layer is on the N− drift layer opposite the conduction layer while a source contact structure including an N+ layer is directly on the conduction layer. With this arrangement, the doping concentration of the entire portion of the device between the N− drift layer and the source contact structure is greater than the doping concentration of the N− drift layer.

In another aspect, the invention relates to a P type FET switch that includes a P− drift layer having a doping concentration and a P type conduction layer on the P− drift layer that has a doping concentration greater than the doping concentration of the P− drift layer. The switch also includes a pair of gate structures, each including a gate contact at one end and an N region at another end. Each gate structure extends into and terminates within the conduction layer such that the N region is within the conduction layer. The switch also includes a drain contact structure including a P+ layer on the P− drift layer opposite the conduction layer and a source contact structure including a P+ layer directly on the conduction layer. With this arrangement, the doping concentration of the entire portion of the device between the P− drift layer and the source contact structure is greater than the doping concentration of the P− drift layer.

These and other aspects and advantages of the invention will become apparent from the following detailed description and the accompanying drawings which illustrate by way of example the features of the invention.

BRIEF DESCRIPTION OF THE DRAWINGS

FIG. 3 is a sectional view of the switch of FIG. 1, illustrating its operation when on.

DETAILED DESCRIPTION OF THE PREFERRED EMBODIMENTS

Figure 1:
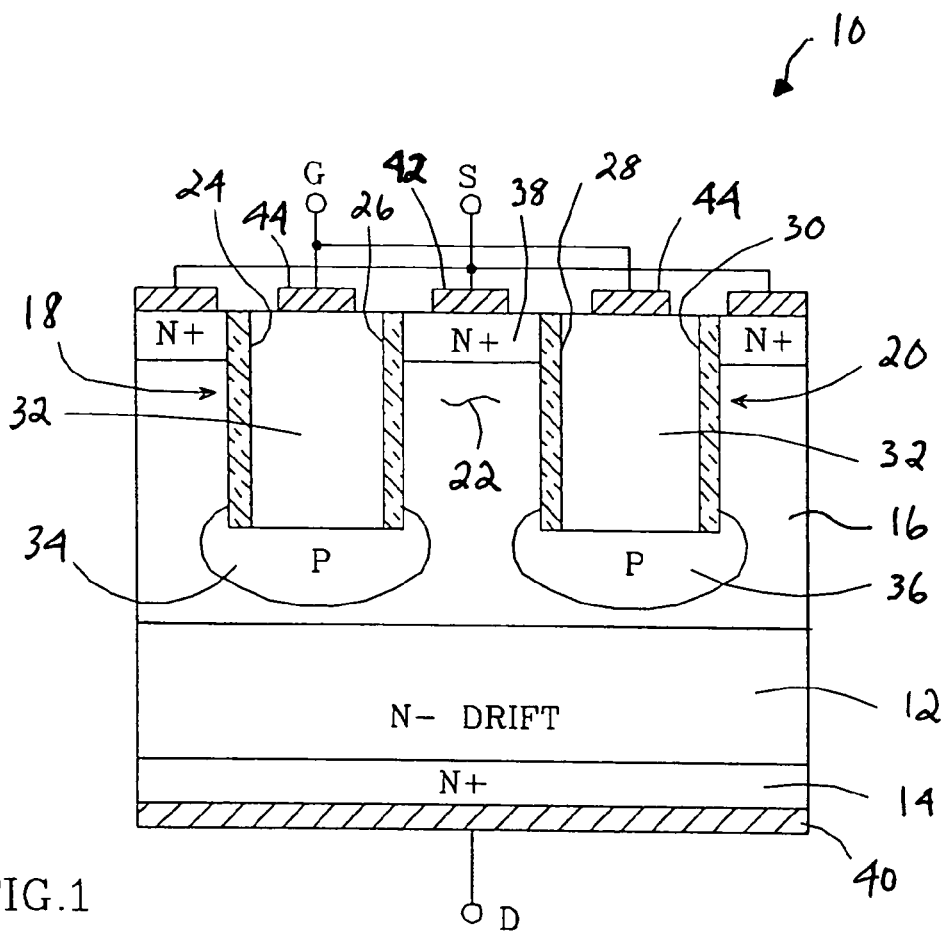
FIG. 1 is a sectional view of one embodiment of a semiconductor device, i.e., a FET switch, configured in accordance with the present invention.

An exemplary embodiment of a semiconductor device 10, e.g., a FET switch, configured in accordance with the present invention is shown in FIG. 1. An N− drift layer 12 having a doping concentration is on a first N+ layer 14. A N type conduction layer 16 having a doping concentration greater than that of the N− drift region 12 is on the N− drift layer.

Recessed into the conduction layer 16 opposite the drift layer 12 are a pair of trench structures 18, 20, which are separated by a mesa region 22 that is comprised of the portion of the conduction layer 16 between the trenches. The trenches 18, 20 are recessed to a predetermined depth, with the depth defining each trench's "bottom". Each trench has oxide sidewalls 24, 26, 28, 30 and is filled with a conductive material 32. At the bottom of each trench is a shallow P region 34, 36, which extends across the bottom and around the corners of each trench's side-walls. The depth of the trench structures 18, 20 is such that the P regions 34, 36 are entirely within the conduction layer 16. A second N+ layer 38 is on the conduction layer 16 within the mesa region 22.

The first N+ layer 14 provides an ohmic contact to the drift layer 12, and a first layer of metal 40 on the N+ layer 14 provides a drain connection for the FET switch. The first N+ layer 14 and the first metal layer 40 define all or a portion of a drain contact structure. The second N+ layer 38 provides an ohmic contact to the mesa region 22, and a second layer of metal 42 on the N+ layer 38 provides a source connection for the switch. The second N+ layer 38 and the second metal layer 42 define all or a portion of a source contact structure. A third layer of metal 44 contacts the conductive material 32 in each of the trenches 18, 20, and provides a gate connection, or contact, for the FET switch.

Figure 2:
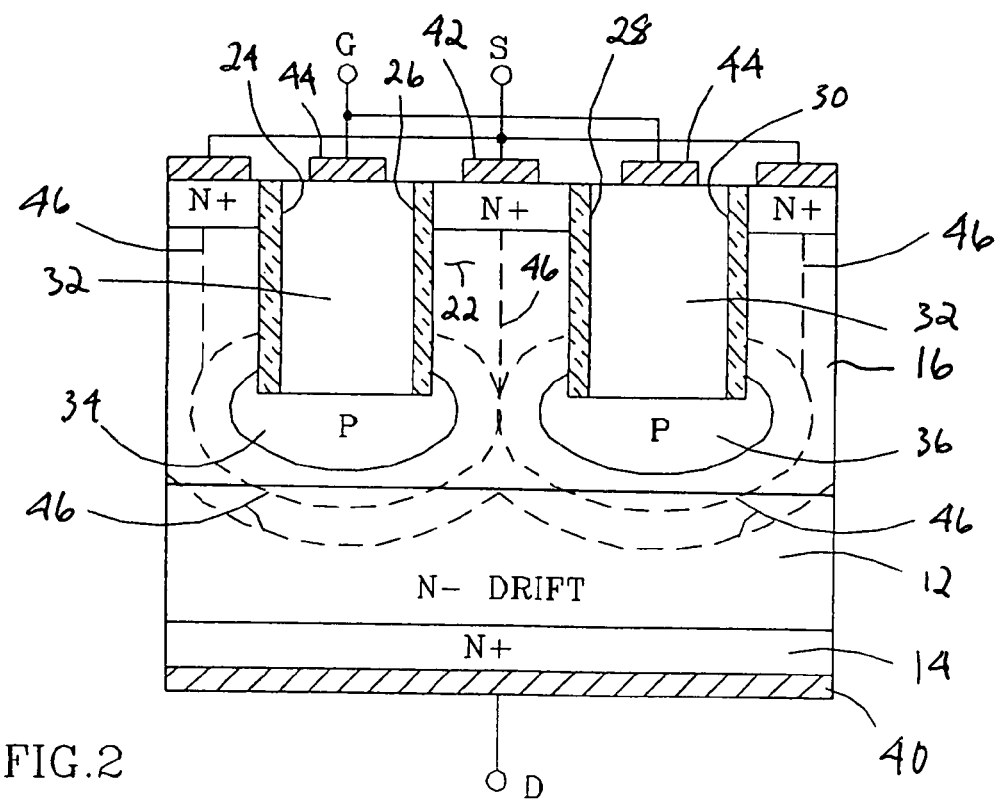
FIG. 2 is a sectional view of the switch of FIG. 1, illustrating its operation when off.

The structure of the switch when "off" is illustrated in FIG. 2. The switch is turned "off" by lowering gate voltage Vg toward a negative voltage sufficient to reverse-bias the junction between the shallow P regions 34, 36 and the conduction layer 16. This causes depletion regions 46 to form around each P region 34, 36 and adjacent to the oxide sidewalls 24, 26, 28, 30. The depletion regions 46 merge in mesa region 22 to form a potential barrier for electrons. This barrier prevents the flow of current between the drain 40 and the source 42. The Vg value needed to turn the device off is dependent on several factors, the most significant of which is the width of the mesa region 22: the wider the mesa region 22, the greater the turn-off value of Vg.

Figure 3:
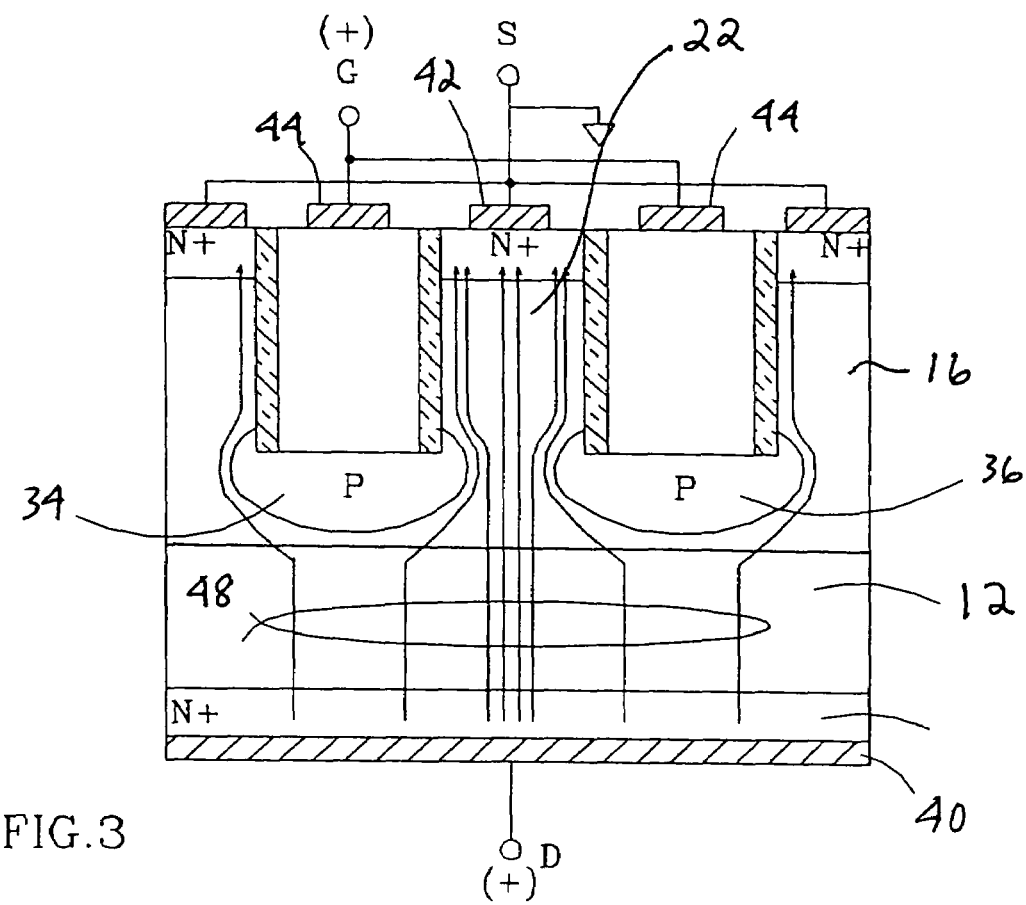

FIG. 3 illustrates how the switch of FIG. 1 is turned "on". A positive Vg voltage, sufficient to overcome the built-in potentials of the p-n junctions present at the interfaces between the P regions 34, 36 and the conduction layer 16, is applied to the gate connection 44. This turns the switch on, such that current 48 is allowed to flow from the drain 40 to the source 42 via the mesa region 22. As described below with reference to FIG. 4, the turn-on voltage Vg for the device is typically less than 2V. Due to this voltage level there is little or no hole injection from the P regions 34, 36 into the conduction layer 16. Because the conduction layer 16 is more heavily doped than the N− drift layer 12, it reduces the out-diffusion of P material from the P regions 34, 36; shrinks the depletion region 46 spreading from the P regions 34, 36; and thereby provides a switch having a lower on-resistance than would be provided by a switch whose P regions are within the less heavily doped N− drift layer 12.

Figure 4:
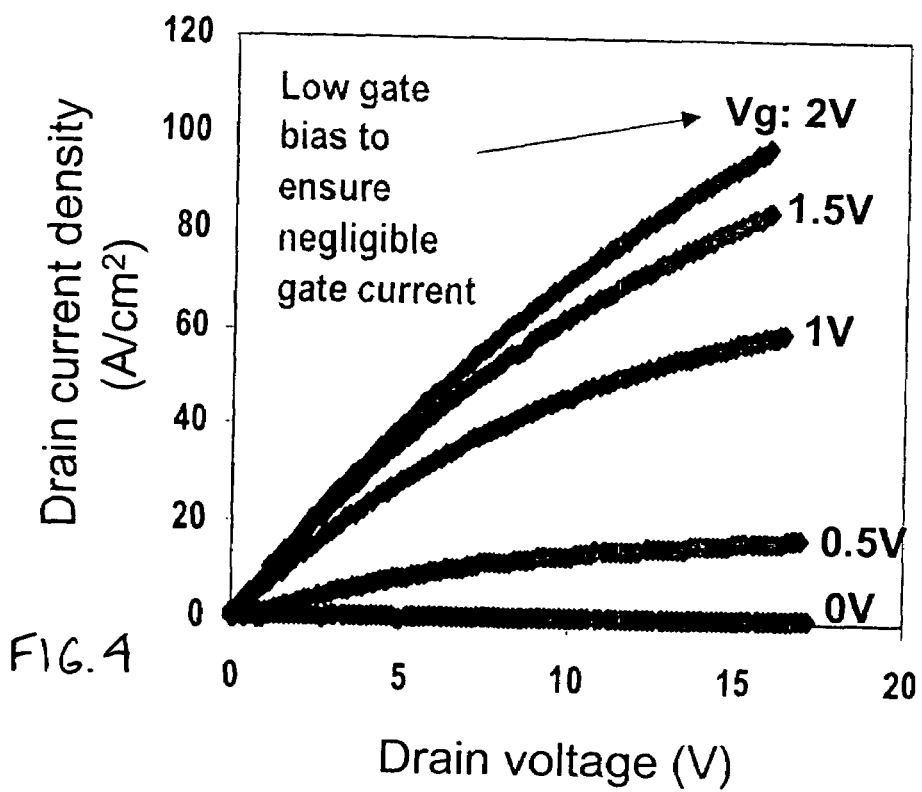
FIG. 4 is a graph plotting drain current vs. drain bias at several different gate-source voltages for a FET switch configured in accordance with the present invention.

The degree of conductivity through the conduction layer 16 is regulated with the voltage applied to the gate contact 44. Experimental plots of the on-state characteristics of the switch are shown in FIG. 4, which plots drain current versus drain bias voltage for gate-to-source voltages Vg of 0, 0.5, 1.0, 1.5 and 2.0 volts. From the plots it is noted that the device provides a high forward current, i.e., drain current density, with a low on-resistance and that the value of Vg necessary to provide a high forward current is low. This low Vg value ensures a negligible gate current, i.e., the current from the gate to the source.

The device is preferably arranged such that a negative gate voltage is required to form the potential barrier needed to turn the device off. That is, with no voltage applied to the gate connection 44, the mesa region 22 should not be completely depleted by the potentials created by the work function difference between the conductive material 32 and the conduction layer 16. If the device was arranged such that the mesa region 22 was completely depleted with Vg=0, the device's on-resistance may be unacceptably high.

The trenches 18, 20 are preferably recessed vertically into the conduction layer 16; i.e., with their side-walls approximately perpendicular to the top surface of the conduction layer. However, the device is not limited to vertically-recessed trenches: each trench may be wider at the top than it is at the bottom, or vice versa. Trenches that are wider at the top than at the bottom make the mesa region wider between the trench bottoms, which tends to lower the switch's on-resistance but may degrade its blocking voltage. Trenches that are wider at the bottom constrict the mesa region, which may increase on-resistance but improve blocking voltage. Vertically-recessed trenches provide a good balance between on-resistance and blocking voltage, and are preferred.

Referring back to FIG. 1: the conductive material 32 in the trenches 18, 20 is preferably polysilicon which has been heavily-doped with acceptors. Polysilicon is preferred because it easily fills the trenches, but other materials that can fill the trenches and provide good conductivity could also be used.

When the switch is required to have a high blocking voltage, i.e., greater than about 300 volts, its conduction layer 16, N+ drift layers 14, 38, N− drift layer 12, and shallow P regions 34, 36, are preferably made from a semiconductor material having a bandgap voltage that is higher than that of silicon (Si), such as silicon carbide (SiC), gallium nitride (GaN), or diamond. The peak electric field that a material can withstand without breaking down, i.e., its "critical field", is proportional to its bandgap voltage. Thus, an SiC layer, for example, is able to sustain a peak field that is about ten times greater than that supportable by an Si layer of comparable thickness. Furthermore, the doping concentration a material is capable of attaining is proportional to its critical field. Thus, SiC's higher critical field enables the switch's material layers to have a doping concentration that is an order of magnitude higher than is possible with Si ($\sim 5\times 10^{15}$ vs. $\sim 8\times 10^{13}$ carriers/cm$^3$).

The higher doping concentration achievable with a wide-bandgap material also lowers the device's on-resistance when compared with an Si implementation. Use of a wide-bandgap material also reduces reverse leakage current. SiC's wide bandgap enables a device's reverse leakage current to be several orders of magnitude less than an Si-based device of comparable thickness. This factor also serves to increase the temperature at which the switch can be operated. Because reverse leakage current increases exponentially with temperature, conventional devices must be operated at lower temperatures to achieve leakage currents as low as that provided by an SiC implementation. Conversely, a switch fabricated from a wide-bandgap material such as SiC can be operated at higher temperatures while still meeting a given reverse leakage current specification.

The device's reverse blocking capability is determined by a number of factors, including the width of the mesa region 22 and the doping and thickness of the conduction layer 16 and the N− drift layer 12. A lower doping concentration of the N type conduction layer 16 requires a wider mesa region 22, which tends to lower the device's on-resistance, but also lowers its blocking voltage. Conversely, a higher doping concentration of the N type conduction layer 16 allows for a narrow mesa region 22, which improves the device's blocking capability, but also increases on-resistance. The doping of the N type conduction layer 16 needs to be properly designed so as to maintain the blocking capability determined by the properties of the N type layer 12.

Reverse blocking voltage increases with increasing thickness and decreasing doping level of the N− drift region 12. A thick and lightly-doped drift region tends to have a high resistance. However, the more heavily doped N type conduction layer acts to significantly lower on-resistance, thereby enabling the fabrication of a device having lightly doped N− drift region 12 to provide a high reverse blocking voltage, while still providing a low on-resistance via the heavily doped N type conduction layer.

The shallow P regions 34, 36 protect the trench oxide from high electric fields. Thus, the doping of the shallow P regions 34, 36 should be sufficient to prevent them from becoming completely depleted when subjected to the switch's rated breakdown voltage. The depletion region from the shallow P regions 34, 36 extend around the trench corners, to protect the corners from premature breakdown caused by high electric fields.

The P regions 34, 36 are preferably made shallow to limit lateral diffusion. To further limit lateral diffusion, it is preferred that the P regions 34, 36 comprise a slow-diffusing material. For an SiC implementation of the switch, the preferred material for the shallow P regions is aluminum.

Careful consideration must be given to the width of the mesa region 22, and the widths and depths of the trenches 18, 20. For example, if a mesa is too narrow, the depletion regions from the P regions 34, 36 may act to pinch off the conductive path and block current flow. If too wide, the reverse blocking voltage may be adversely affected.

Figure 5:
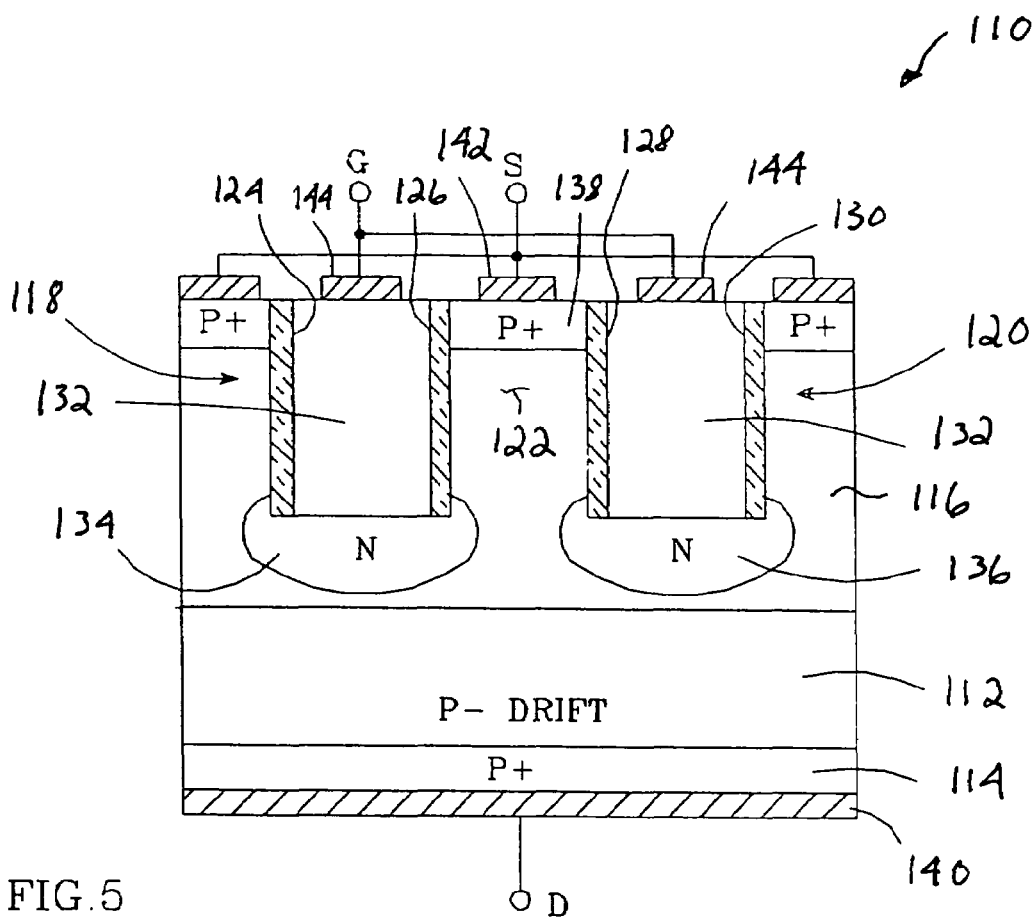
FIG. 5 is a sectional view of an opposite polarity version of the device of FIG. 1.

The present FET switch is not limited to the structure shown in FIG. 1. An opposite polarity embodiment of a FET switch 110 is shown in FIG. 5, in which each of the materials has been swapped with its opposite polarity counterpart. Here, a P− drift layer 112 having a doping concentration is on a first P+ layer 114 and a P type conduction layer 116 having a doping concentration greater than that of the P− drift layer is on the P− drift layer.

A pair of trenches 118, 120 are recessed into the conduction layer 116 opposite the drift layer 112 and P+ layer 114, and are separated by a mesa region 122. Each of the trenches 118, 120 has oxide side-walls 124, 126, 128, 130 and is filled with a conductive material 132. A shallow N region 134, 136 is at the bottom of each trench. The depth of the trench structures 118, 120 is such that the N regions 134, 136 are entirely within the conduction layer 116.

A second P+ layer 142 is on the P− drift layer 138 within mesa region 122. The first P+ layer 114 provides an ohmic contact to the drift layer 112, and a first layer of metal 140 on the P+ layer 114 provides a drain connection for the FET switch. The second P+ layer 138 provides an ohmic contact to the mesa region 122, and the second layer of metal 142 on the P+ layer 138 provides a source connection for the switch. A third layer of metal 144 contacts conductive material 132 in each of the trenches, providing a gate connection for the switch. The conductive material is preferably polysilicon which has been heavily-doped with donors, or acceptors.

The switch functions as before, except that the switch is turned on by applying a negative gate voltage to gate connection 144 sufficient to overcome the built-in potentials of the p-n junctions present at the interfaces between N regions 134, 136 and the conduction layer 116. This allows current to flow from source 142 to drain 140. A positive gate voltage sufficient to reverse-bias the junction between the shallow N regions 134, 136 and the conduction layer 116 turns the device off.

Figure 6:
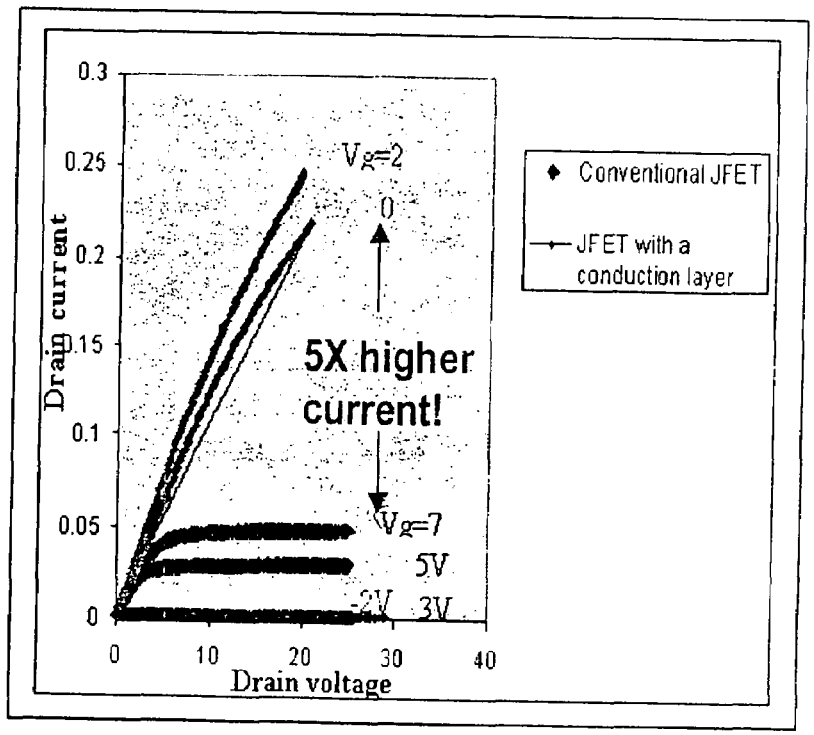
FIG. 6 is a graph plotting drain current vs. drain bias at several different gate-source voltages for a conventional FET switch and a FET switch configured in accordance with the present invention.

With reference to FIG. 6, a comparison of current-voltage family curves between a conventional JFET (i.e., one without a conduction layer 16, 116) and a novel JFET configured in accordance with the present invention is shown. Both JFETs were fabricated on an SiC wafer with a doping concentration of 100 μm, $\sim 5\times 10^{14}$ cm$^{-3}$ for their respective drift layers and a doping concentration of 4 μm, $\sim 1\times 10^{16}$ cm$^{-3}$ for the conduction layer in the novel JFET. As shown in FIG. 6, the novel JFET can conduct more than five times higher forward current than the conventional JFET at a significantly lower gate voltage Vg−2V verses 7V. It has been observed that the conventional JFET exhibited a gate leakage current in the mA range for a Vg of 7V, while the novel JFET exhibited a gate leakage current only in the μA range for a Vg of 2V.

To provide a high power switch, the structures of FIGS. 1, 5 (each of which depict an individual device "cell"), are repeated across a die having an area sufficient to provide the necessary current carrying capacity. This is illustrated in the cross-sectional view shown in FIG. 7 of an exemplary high power FET switch. A die 200 has an N− drift layer 202 on an N+ layer 204, with a metal layer 206 on the N+ layer providing a drain connection. The die also has a N conduction layer 205 on the N− drift layer 202. Each of these layers runs approximately the full length and width of the die.

A number of trench structures 208 are spaced periodically across the die, each of which has the same structure as the trenches shown in FIG. 1; i.e., filled with a conductive material 210 and having oxide side-walls 212, with a shallow P region 216 at its bottom that lies within the conduction layer 205. A layer of metal 218 contacts the conductive material in each trench to provide a gate connection. Mesa regions 220 are located between each pair of trenches; an N+ layer 222 is on the N conduction material in each of the mesa regions; and a layer of metal 224 connects all of the N+ layers together to provide a source connection.

The switch operates as described above: when a low-level positive gate voltage, e.g., approximately 2V or less, is applied, current flows between drain and source via the mesa regions.

The trench structures 208 may be arrayed across the die in a wide variety of ways. One arrangement is illustrated in FIG. 8, which is a plan view that corresponds with the cross-sectional view of FIG. 7 (metal layers 206, 218, and 224 are not shown for clarity). The trench structures 208 form channels that run the length of the die 200 and are spaced periodically across its width.

Figure 7:
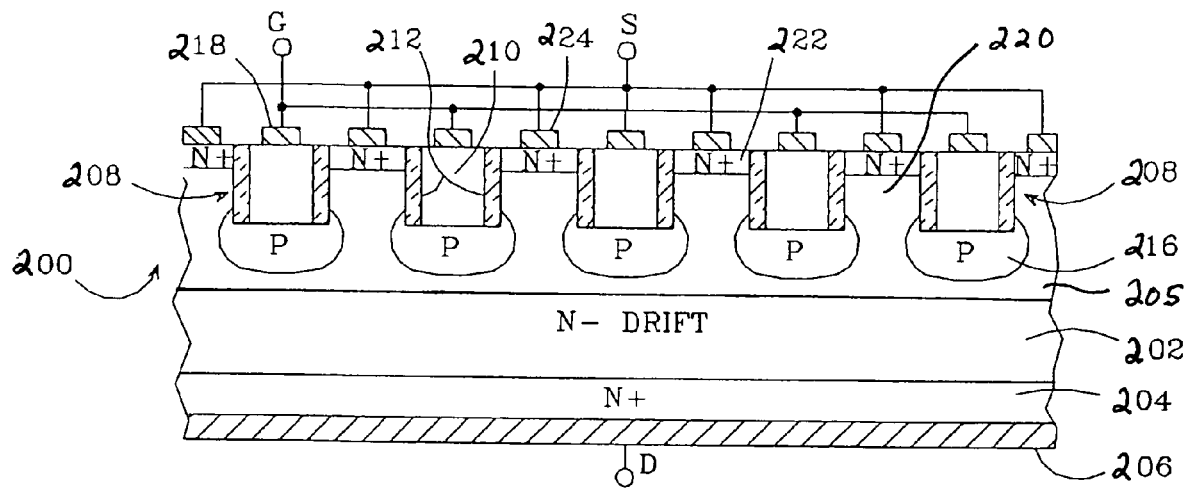
FIG. 7 is a cross-sectional view of a multiple-cell implementation of a switch, cut along section lines 7-7 in FIGS. 8, 9 and 10.
Figure 8:
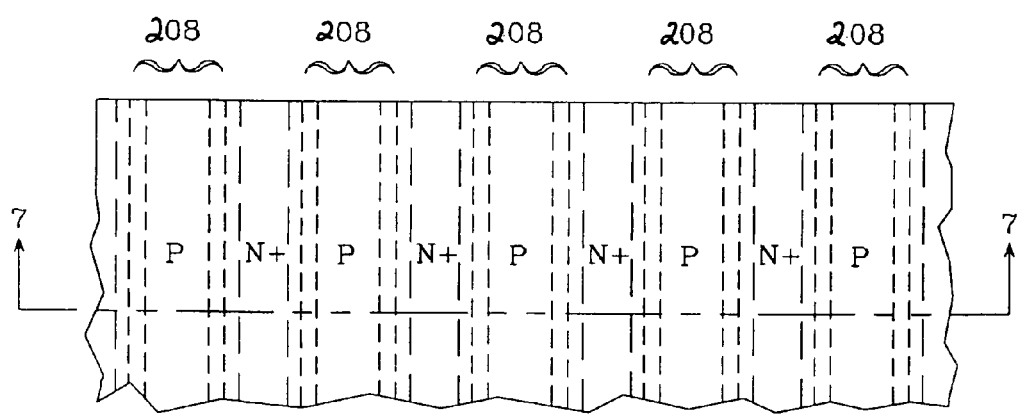
FIG. 8 is a plan view of one embodiment of a multiple-cell implementation of a switch.
Figure 9:
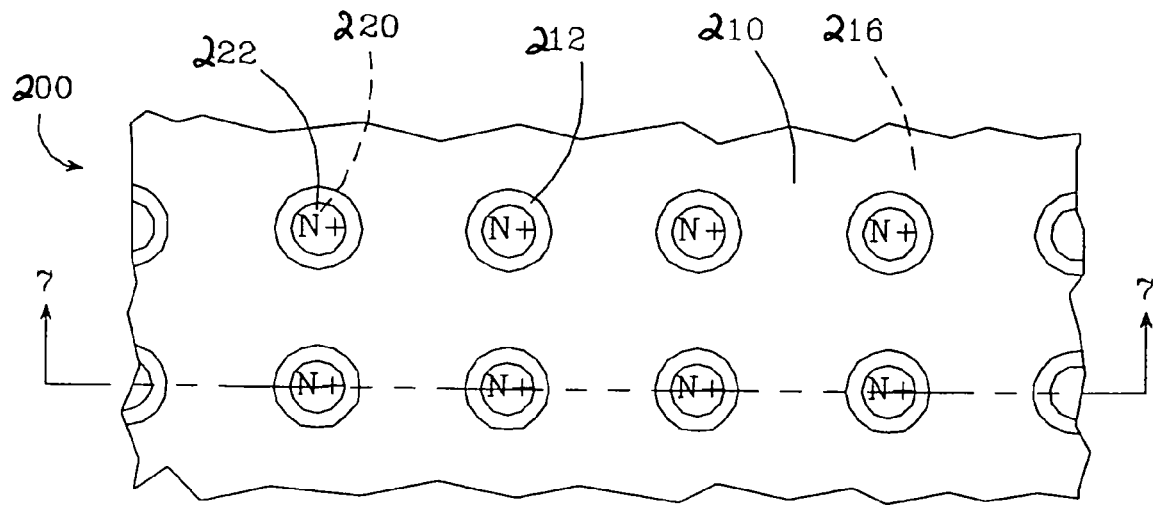
FIG. 9 is a plan view of another embodiment of a multiple-cell implementation of a switch.

Another possible trench structure arrangement is shown in FIG. 9, which also corresponds with the cross-sectional view of FIG. 7. Here, the N+ layers 222 and the mesa regions 220 below them are cylindrical in shape and the oxide side-walls 212 surrounding the layers and regions are spaced periodically within the die 200. The trench structures' conductive material 210 and the buried P regions 216 occupy the area between the cylindrical mesa regions. Note that an alternative arrangement to that shown in FIG. 9 is also possible, in which the mesa regions 220 and the trench structures 208 are reversed. The trench structures could be circular in shape and surrounded by cylindrical oxide side-walls, and spaced periodically within the die 200, with the trench structures 208 recessed in the area between the mesa regions 220.

Figure 10:
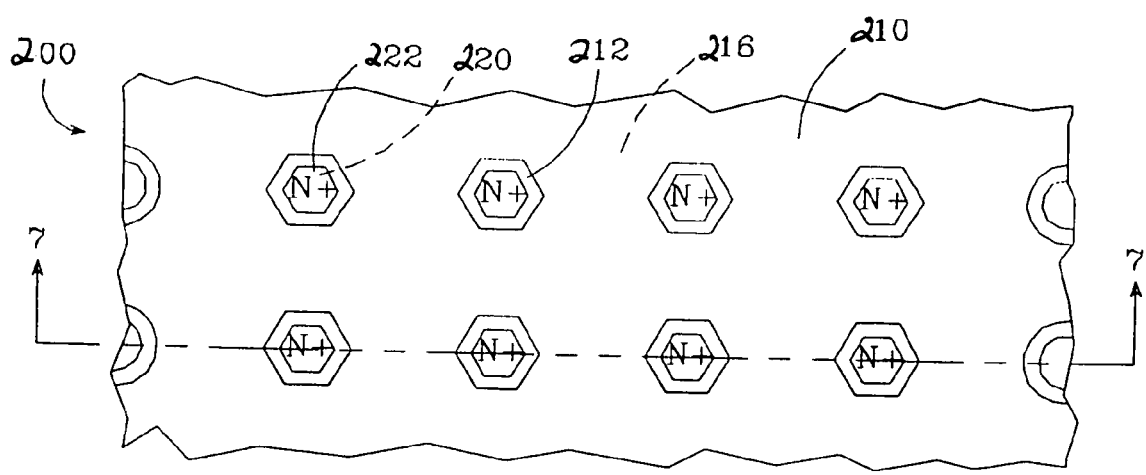
FIG. 10 is a plan view of yet another possible embodiment of a multiple-cell implementation of a switch.

The perimeter of each of the mesa regions or trenches may also describe a polygon. One particularly efficient example of this is shown in FIG. 10, which also corresponds with the cross-sectional view of FIG. 7. Here, the N+ layers 222, the mesa regions 220 below them, and the oxide side-walls 212 surrounding them are hexagonal in shape, and are spaced periodically within the die 200.

The trench structure arrays shown in FIGS. 7-10 are merely exemplary; many other possible trench and mesa geometries and arrangements are possible which will result in switches that adhere to the principles of the invention.

A "termination" typically surrounds an array of cells as described above, to protect the cells on the outer edges of the array. For the present switch, it is preferable that the termination depth extend well into the drift layer. This serves to better protect the outlying trench structures, and reduces the sharpness of the termination's corners, which enhances the termination's ability to protect the trenches from high electric fields.

When the conduction layer is N type material, the termination is typically P type. Thus, the termination may be formed with the same P type material as is used for the buried P regions below each trench.

It will be apparent from the foregoing that while particular forms of the invention have been illustrated and described, various modifications can be made without departing from the spirit and scope of the invention. For example, while the above detailed description has focused on embodiments of the invention related to FETs, the invention may be used in other semiconductor devices such as insulated gate bipolar transistors (IGBTs). Accordingly, it is not intended that the invention be limited, except as by the appended claims.

I claim:

1. A junction field-effect transistor (JFET) comprising:
a drift layer of a first conductivity type having a first doping concentration;
a conduction layer of the first conductivity type on the drift layer and having a second doping concentration greater than the first doping concentration;
a pair of trench structures, each of said trench structures comprising a pair of oxide sidewalls recessed into said conduction layer, each trench structure including a trench contact at one end and a region of a second conductivity type opposite the first conductivity type at another end, each of said trench structures filled with polysilicon to provide a low resistance conductive path between said trench contact and said region of a second conductivity type, each trench structure extending into and terminating within the conduction layer such that the second-conductivity-type region is entirely within the conduction layer, each of said second-conductivity-type regions extending around and thereby protecting the bottom corners formed by said oxide sidewalls, said trench contacts connected together to provide a gate contact for said JFET;
a first contact structure on the drift layer opposite the conduction layer, said first contact structure providing a drain contact for said JFET; and
a second contact structure on the conduction layer, said second contact structure providing a source contact for said JFET, such that said conduction layer is between said drift layer and said source contact;
wherein the second contact structure is directly on said conduction layer so that the doping concentration of the entire portion of the device between the drift region and the second contact structure is greater than the doping concentration of the drift region;
wherein the application of a voltage to said gate contact greater than the built-in potential that exists between the second-conductivity-type regions and the conduction layer causes current to flow between the first contact and the second contact, and the application of a voltage to said gate contact sufficient to reverse bias the junctions between the second-conductivity-type regions and the conduction layer prevents current from flowing between the first contact and the second contact,
such that said built-in potential and the on-resistance of said JFET is lower than that of an otherwise equivalent JFET lacking said conduction layer having a second doping concentration greater than the first doping concentration,
said conduction layer, said drift layer and said regions of a second conductivity type comprising silicon carbide (SiC).

2. The device of claim 1 wherein the first conductivity type is N.

3. The device of claim 1 wherein the first conductivity type is P.

4. The device of claim 1 wherein the first contact structure comprises a layer of the first conductivity type having a third doping concentration greater than the first doping concentration.

5. The device of claim 4 wherein the third doping concentration is greater than the second doping concentration.

6. The device of claim 1 wherein the second contact structure comprises a layer of the first conductivity type having a fourth doping concentration greater than the first doping concentration.

7. The device of claim 6 wherein the fourth doping concentration is greater than the second doping concentration.

8. The device of claim 6 wherein the first-conductivity-type layer is directly on the conduction layer.

9. The device of claim 1 wherein the first doping concentration is less than any other doping concentration of the device.

10. A junction field-effect transistor (JFET) switch comprising:
- an N− drift layer having a doping concentration;
- an N type conduction layer on the N− drift layer and having a doping concentration greater than the doping concentration of the N− drift layer;
- a pair of trench gate structures, each of said trench structures comprising a pair of oxide sidewalls recessed into said conduction layer, each trench structure including a gate contact at one end and a P region at another end, each of said trench gate structures filled with polysilicon to provide a low resistance conductive path between said gate contact and said P region, each gate structure extending into and terminating within the conduction layer such that the P region is entirely within the conduction layer, each of said P regions extending around and thereby protecting the bottom corners formed by said oxide sidewalls;
- a drain contact structure including an N+ layer on the N− drift layer opposite the conduction layer; and
- a source contact structure including an N+ layer directly on the conduction layer so that the doping concentration of the entire portion of the device between the N− drift layer and the source contact structure is greater than the doping concentration of the N− drift layer, such that said N type conduction layer is between said N− drift layer and said source contact;

wherein the application of a positive voltage to the gate contacts greater than the built-in potential that exists between the P regions and the conduction layer causes current to flow between the drain contact and the source contact, and the application of a voltage to the gate contacts sufficient to reverse bias the junctions between the P regions and the conduction layer prevents current from flowing between the drain contact and the source contact, such that said built-in potential and the on-resistance of said JFET switch is lower than that of an otherwise equivalent JFET switch lacking said conduction layer having a doping concentration greater than the doping concentration of the N− drift layer, said conduction layer, said drift layer and said P regions comprising silicon carbide (SiC).

* * * * *